United States Patent [19]

Barnes

[11] 4,199,727
[45] Apr. 22, 1980

[54] MALFUNCTION DETECTOR

[76] Inventor: Austen B. Barnes, 337 Sheppard Ave. E., Pickering, Ontario L1V 1E6, Canada

[21] Appl. No.: 896,304

[22] Filed: Apr. 14, 1978

[30] Foreign Application Priority Data

Nov. 7, 1977 [GB] United Kingdom ............... 46282/77

[51] Int. Cl.² .................... H03K 17/28; H03K 19/24
[52] U.S. Cl. ......................................... 328/71; 328/1; 307/218; 307/293
[58] Field of Search ............................ 328/1, 71, 129; 307/218, 293

[56] References Cited

U.S. PATENT DOCUMENTS

| | | | |
|---|---|---|---|
| 3,560,863 | 2/1971 | Baumoel | 328/129 |
| 3,836,859 | 9/1974 | Behrens et al. | 328/71 X |
| 3,939,361 | 2/1976 | Aidala et al. | 328/129 X |

*Primary Examiner*—John S. Heyman

[57] ABSTRACT

Malfunction Detector apparatus has a plurality of sensing means, each sensing means is designed to provide a signal when an operation is performed and a different signal when the operation is not performed. Circuitry is designed to initiate timing and if all sensing means do not signal 'operation performed' by the end of a timed interval, then to provide a 'fault' signal.

3 Claims, 6 Drawing Figures

MALFUNCTION DETECTOR

This invention relates to a circuit for a malfunction detector which monitors the occurrence of events in an industrial process. The commonest type of application for the invention would be in the monitoring of the operation of a cyclically operating machine, for example a punch press.

The terms 'high' or 'low' herein correspond to the potential levels of signals provided at the outputs and inputs of the logic or integrated circuit elements referred to herein. Although the terms 'high' or 'low' in the specific embodiment correspond, respectively, to more and less positive potentials; it will be understood that, in a different circuit, within the scope of the invention, the terms high or low could correspond, respectively, to more and less negative potentials with the diodes and other polar elements reversed or arranged accordingly.

The circuit provides a plurality of sensor-responsive elements each corresponding to an step or operation in such industrial process and each individually connectable to receive a signal from a corresponding sensor when such particular step or operation has occurred. The sensor-responsive elements are designed to have a binary output having a first binary state indicating "operation not performed" prior to the receipt of such signal from a sensor and a second binary state indicating "operation performed" after receipt of such signal. A timer is designed to provide a predetermined first "timed interval" binary signal to a logic circuit for a timed interval and during such timed interval the sensor-responsive elements are activated. The overall circuit is designed so that a second input to the logic circuit assumes a first state indicating "not all operations performed" when less than all the sensor-responsive elements are in the second or "operation performed" if the outputs of all the sensor-responsive elements assume the second or "operation performed" state. The logic module is designed so that if the second input reaches its second or "all operations performed" state before the end of the timed interval, no 'fault' signal is sent out by the logic circuit. On the other hand if the timed interval ends before all outputs of the sensor-responsive elements assume the second "operation performed" state (and the second input to the logic module assumes the "all operations performed" state) then the logic circuit provides a 'fault' signal indicating that one of the sensed operations has not take place. Such fault may, of course, be used both to stop the performance of the industrial process evidencing the fault and to provide a visual or audible alarm. It will be noted that because of the 'ANDed' arrangement of the sensor-responsive element outputs to the second logic circuit input, the system is completely flexible as to the number of events which may sensed and to the modification of the circuit to sense more or less events.

In a second aspect of the invention the circuitry, as above described, makes use of an integrated circuit for which a variety of exterior connections have been designed to allow the same integrated circuit to provide a number of the operational element functions of the circuit. This feature of the invention will be explained together with the preferred embodiment after reference to the drawings. The integrated circuit is most commonly known as the '555' and a suitable model is manufactured by 'Signetics Corporation'. Both the '555' and its manufacture are more fully identified hereafter.

Figure 1:
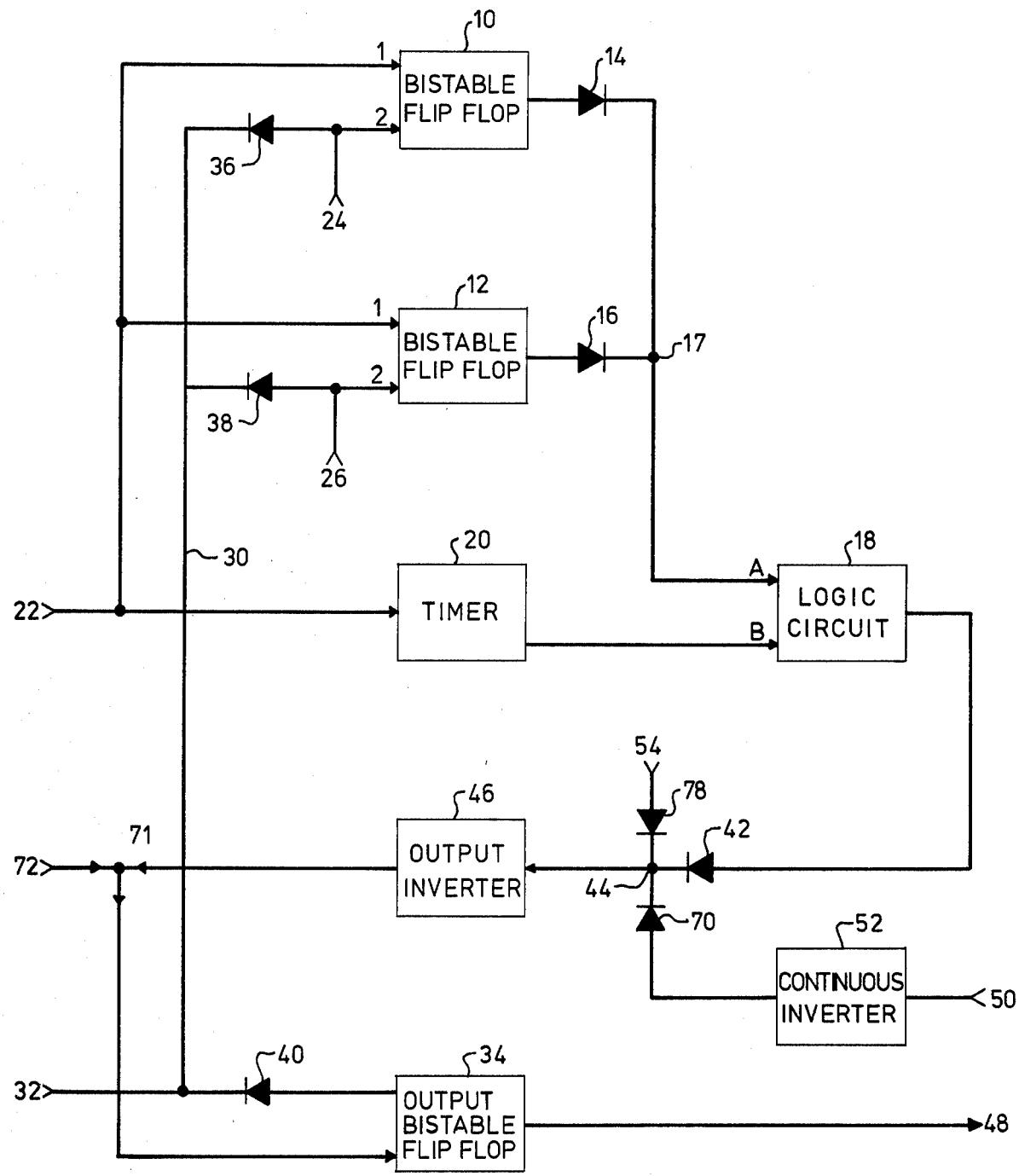
FIG. 1 shows a general view of the overall circuit.

FIG. 1 shows the overall circuit of the invention in block form. A pair of bistable flip-flops, 10 and 12 represent the sensor-responsive elements for sensing, respectively, the performance of first and second operations of an industrial process. As described heretofore and hereinafter as many flip-flops of the type represented by blocks 10 and 12 and their connections, as shown, may be provided as there are steps or operations to be sensed. The outputs of the bi-stable flip flops 10, 12 etc are connected to node 17 through rectifiers 14 and 16 poled to conduct toward node 17. Node 17 is connected to input A of a logic circuit 18. A timer 20 has its output connected to input B of the logic module 18. Input 22 is connected to receive a signal from an outside source and supplies the signal to the #1 inputs of flip-flops 10, 12 etc and to the input of timer 20. The elements 10 and 12 are each arranged, on receipt of such signal at their number 1 inputs, to cause a first or high output from flip-flops 10 and 12 corresponding to "operations not performed". The signal from input 22 acts upon the timer to cause it to send a first 'timed interval' binary signal to the input B of logic module 18. The #2 input of flip-flops 10 and 12 are each connected to a separate sensor (not shown) through inputs 24 and 26 respectively. Each sensor senses the performance (or not) a particular event or operation connected with the industrial process and, is designed to send (here) a first high ("operation not performed") signal to its connected flip-flop, up to the time when the operation is performed and, on such performance, to send (here) a second low ("operation performed") signal to its flip flop. The flip flop does not respond to the first or "operation not performed" signal but on receipt of the second or "operation performed" signal switches its output to provide at its output its own or "operation performed" signal to node 17.

Line 30 is connected to input 32 which provides a reset signal (of the same binary value as the "operation performed" signal) to input 2 of the flip flops 10, 12 etc and also to an output bistable flip flop 34. Rectifiers 36, 38 40 poled to conduct from the flip-flops 10, 12, 34 respectively, toward line 30 are located between the inputs from the sensors and line 30 and between flip-flops 34 and line 30.

Logic circuit 18 is designed to provide a first output signal (here low) on all permutations of the binary inputs A and B except in the combination of B low and A high in which permutation circuit 18 is designed to provide a second signal (here high) acting as a fault signal and indicating—"all operations not performed in timed interval." It will be noted that due to the rectifiers 14, 16 between the respective flip-flops and node 17 connected to the A input of the logic module, this input A will remain high (positive) until all operation sensing flip flops 10, 12 provide a low input to input A of the logic module. Thus the low outputs of the operation sensing flip flops are "AND'ed" at node 17.

The logic module 18 is designed to provide a low output under quiescent or no-fault conditions and a high output under fault conditions. The output of logic module 18 is applied through diode 42 poled to conduct away from the logic module 18 to node 44 which in turn is connected to the input of the output invertor 46 which provides a corresponding inverted output to output bistable flip flop 34. Thus the high (on fault) output of logic circuit 18 becomes a low (on fault) output from output invertor 46 and is used to set output bistable flip-flop 34 to provide an output 48 indicative of fault which may actuate a mechanical or electrical alarm or to activate relay to stop the operation of the industrial process. As previously explained, the output bistable flip-flop 34 is reset by a signal provided to reset line 30.

To the circuitry above described for detecting cyclic operating faults in an industrial process there may be added connections for detecting faults in steady state conditions.

Usually the sensor for a faulty steady state condition will be designed to provide a signal which is low on fault. Often it is desireable to have a signal which may be made high on fault for the purpose of illuminating a light emitting diode (LED). Thus such low fault signals may be provided from an input to the input of a continuous invertor 52. The continuous invertor 52 puts out an inverted output, high on fault, which connects to node 44 through a diode 70, poled to conduct toward node 44. It will be noted that, as many steady state conditions may be individually sensed with low on fault outputs may be connected to node 44 through similar continuous invertors 52 and diodes 70, due to the 'OR'ing function permitted by diodes 70, 42 and 78 at node 44. Moreover in each such steady state sensing means, a light emitting diode LED may be provided between the invertor 52 and diode 70 which will indicate the existence of a fault and its location. Where a low input is available to indicate a fault in a steady state condition, but no visual signal is required this may be provided directly to the pputput bistable flip-flop 34 at input 72. Should there be a steady state condition wherein a fault is best indicated by a high signal on fault, such signals may be applied to node 44 over input 54, rectifiers 78 poled to conduct toward the node.

It will be noted that the low output of the output invertor 46 exists only for as long as the fault condition. However the output bistable flip-flop 34 acts as a latch and its output, once switched to indicate a fault will continue to do this, until flip-flop 34 is reset. Such bistable latches may also be conveniently interposed in the circuit to provide signal location of short-term faults which may self correct when the machine is stopped, but which may recur and repeatedly stop the machine.

It should be noted that since logic module 18 is designed to provide a fault signal when B is low and A is high that on initiation of operation by a signal from input 22 that a delay may be required in the lines to flip-flops 10 and 12 to ensure that n either of flip flops 10 or 12 provides, temporarily, high output to terminal A before the output of timer 20 is also high, during the timed interval.

In operation, a system is provided to check on the performance of a number of steps in an industrial process, the number of steps corresponding to the number of flip flops of the type and connections of 10 and 12. In the quiescent state the outputs of the flip-flops 10 and 12 etc are low as is the output of timer 20. The quiescent output of output bistable flip-flop 34 is high.

An actuating signal is sent on line 22 which initiates the operation of timer 20 causing its output to be high for the predetermined timed interval. At the same time or immediately thereafter, as previously discussed, the outputs of flip-flops 10, 12 etc are set high by the same signal. During the timed interval the input B remaining high the outputs of the flip flops 10, 12 etc individually go low as the corresponding steps in the industrial process are performed. The input A will remain high until all outputs of flip-flops 10, 12 etc are low. If, assuming all steps are performed in time in the industrial process, the flip flops 10, 12 etc all go low within the timed interval then input A will go low before the input B goes low at the end of the timed interval. The logic circuit 18 therefore will not send out a fault signal. If, however, one or more of the sensed steps in the process are not performed in the timed interval, then input A of logic module 18 will still be high when input B is sent low by the timer at the end of the timed interval. The logic module is designed on receipt of a low input at B with a high input or A to provide a high (on fault) signal through rectifier 42 to node out-put invertor 46. The resultant output from the output invertor 46 causes output bistable flip-flop 34 to latch on its fault output to operate a relay to stop the process or to cause a visual or audible alarm as previously discussed. So far as the detection of faults in steady state conditions is concerned, no operation of the circuitry shown, up to the logic module, is involved. The fault signals resulting from the sensing of steady state conditions, are applied at node 44 or at input 72 either directly or via inputs 50 or 54 at appropriate binary level. Any such fault signal will cause the output of output bistable flip flop 34 to latch at a fault output.

The bistable flip-flops 10, 12 etc and 34 plus any others used in the circuit are reset by a low signal from terminal 32 as previously discussed.

The invention also relates to the use of a preferred type of integrated circuit for the timer 20, logic module 18, output invertor 46 and the continuous invertor 52. The preferred circuit is known as the '555' with various prefixes or affixes and is manufactured by Signetics Corporation, Wolf Rd & Arquess Avenue, Sunnywale, Calif. USA 94086. Similar devices which will also serve the purpose discussed below are:

SE555/NE555—(Intersil and Signetics)
RM555/RC555—(Raytheon)
MC1555/MC14555—(Motorola)
LM555/LM555—(National Semiconductor)
SN52555/SN72555—(Texas Instruments)
CA555/CA555C—(RCA)

The 556 series such as XR2556 or D555 which are all dual 555 integrated circuits in the same integrated circuit chip, can be used. Also, Quad 555 units available under various designations, may also be used.

The 555 model and its equivalents, referred to above, are sold commercially as a timer and no claim is therefore made to any novelty in the use of such circuit to embody timer 20. However it is considered novel, and a facet of this invention, to use such 555 or equivalent circuit with modified exterior connections from the timer to provide the continuous invertor 52, the output invertor, the logic module, bistable flip flops, and output bistable flip flop.

Figure 2:
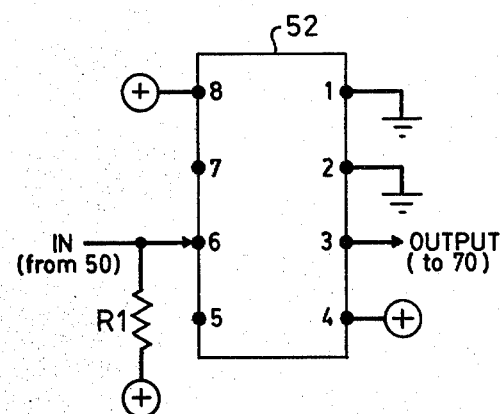
FIG. 2 shows the connections of the preferred integrated circuit for use as the continuous invertor of FIG. 1.

FIG. 2 shows the eight exterior terminals of the 555 and the connections to employ the 555 circuit as the continuous invertor. In this arrangement the input (from terminal 50) is connected to threshold terminal 6 which terminal is also connected to positive bias through a 1 Megohm resistor R1. Terminals 1 (ground) and 2 (trigger) are grounded while terminals 7 (discharge) and 8 (+voltage) are connected to a positive D.C. source. Terminal 3 (output) is connected to diode 70. The operation of the continuous invertor is that a high input at terminal 6 produces a low output. When terminal is grounded as a fault, terminal 3 goes high as a fault signal and this high signal is applied through diode 70 to output invertor 46.

Figure 3:
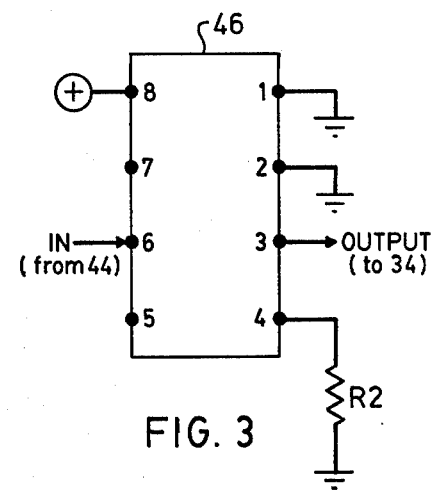
FIG. 3 shows the same integrated circuit connected to act as the output invertor of FIG. 1.

FIG. 3 shows the exterior connections for the '555' type integrated circuit used as the output invertor. All connections are the same as FIG. 2 except: The output 3 is connected to flip-flop 34; the reset terminal 4 is connected through a resistance R2 (1 Megohm) and to ground and the input from node 44 is connected to threshold terminal 6 which has no other connection. When the threshold voltage at node 60 is lower than $\frac{2}{3}$ of the supply voltage at terminal 8 the output at terminal 3 is high (no fault). When the threshold voltage at node 60 is higher than $\frac{2}{3}$ the supply voltage the output goes low indicating a fault to node 71 and through it to output bistable flip-flop 34.

Figure 4:
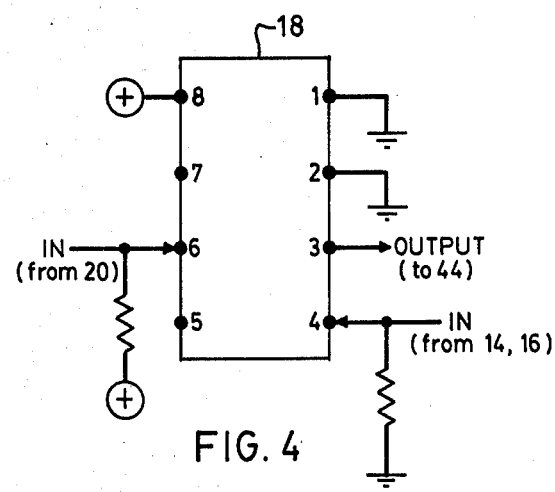
FIG. 4 shows the same integrated circuit connected to act as the logic circuit of FIG. 1.

FIG. 4 shows the exterior connections for the 555 type integrated circuit used as the logic circuit 18. Connections 1,2,3,5,7 and 8 are same as in FIG. 3 the output 3, of course, being connected to node 44 through the diode 42. The reset 4 is biased low with a resistor R3 (1 Kilohm), is the terminal A input of FIG. 1, and connected to receive the (high on incomplete performance) input from diodes 14, 16. The threshold 6 is biased positive through a high resistor, is the terminal B input of FIG. 1, and connected to receive the (high during interval, low after interval) output of timer 20. The effect of the grounded trigger line 2, and the connections to reset terminal 4 and threshold terminal 6 is to provide a low output at terminal 3 (to node 44) except in the permutation where the reset input 4 is high (indicating incomplete performance of the steps in the process) while the threshold input 6 is low (indicating the end of the timed interval).

Figure 5:
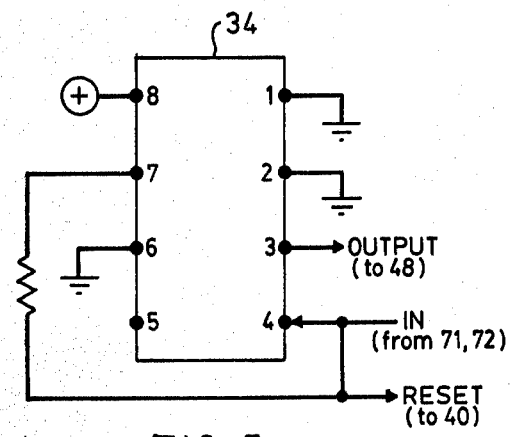
FIG. 5 shows the same integrated circuit connected to act as the output bistable flip flop of FIG. 1.

FIG. 5 is included to show the exterior connections for the 555 integrated circuit used as the output bistable flip-flop 34 in FIG. 1. Connections 1, 2 and 6 are grounded, terminal 8 is positive, and terminal 3 is the output.

The input and reset is terminal 4, with a latch connection through a 50 ohm. resistor to terminal 7.

If 4 is made high or low, 3 follows and the connection to 7 which is the "discharge" terminal of the 555 always tends to lock the output at the low state and remain inactive at the high state.

On high input, terminal 7 has a high resistance to ground, but on low input 7 has low resistance to ground. To swing the output high, the input from 71 or 72 must be sufficient to supply the ground current through the 50 ohm resistor and provide the voltage to start the number 4 terminal input circuit to swing to the high state, which 7 then follows, dropping the ground current to almost 0. The reset is also connected to the input via the diode located at 40.

Figure 6:
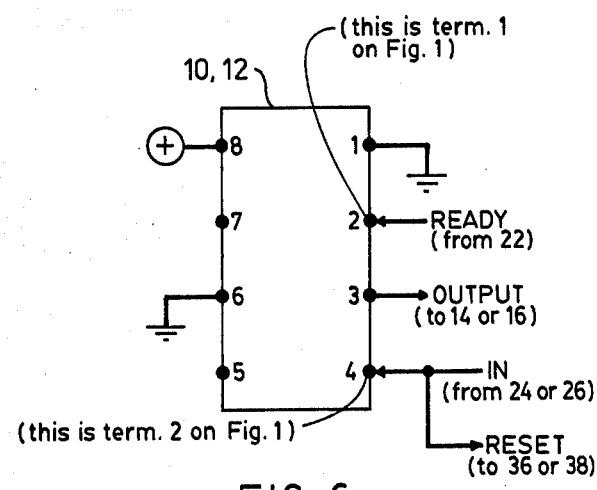
FIG. 6 shows the same integrated circuit connected to act as the bistable flip flops 10 or 12 of FIG. 1.

FIG. 6 shows the exterior connections for the 555 integrated circuit used as the bistable flip-flops 10 and 12 in FIG. 1. Connections 1 and 6 are grounded, terminal 8 is to positive, and terminal 3 is the output.

The input and reset is terminal 4, and a separate input is provided at terminal 2 which, by virtue of the characteristics of the 555 connected in this mode is overruled by the input 4 when 4 is low. When 4 is high, 2 will control the output.

If 4 is set high, 3 is high, if 2 is low and 3 is low if 2 is high, but once 2 is set low and 3 goes high setting 2 high again does not change 3 back to low. 3 latches high until 4 is set low.

If 4 is set low, 3 goes low no matter what 2 is set to.

In FIG. 1, line 1 connects to terminal 2 and line 2 from the diodes 36 and 38 or inputs 24 and 26 to terminal 4.

When inputs 22 is set low, outputs from terminals 3 connecting through diodes 13 and 16 are set high, which causes point 17 to go high.

When inputs 24 or 26 are set low, the outputs at 14 and 16 go low sending 17 low, even though 22 may still be high. If either or both 24 and 26 fail to go low, 17 will stay high. The flip-flops can be reset to output low again only by setting line 30 low via input 32.

Thus this invention provides means for supervising the performances of an industrial process and means for utilizing in different capacities the timer integrated circuit '555' or equivalent.

I claim:

1. Malfunction detection apparatus comprising:
   a plurality of sensor-responsive elements each corresponding to the performance of an operation,
   each of said elements being designed to provide an output signal of a first state absent a signal that the operation to which it corresponds is not performed and of a second state after receipt of a signal that the operation to which it corresponds is performed,
   a logic circuit connected to have a first input and a second input,
   circuitry connected to receive said output signals and to provide to said first input a signal of one potential to said first input when all said output signals are in said second state and to provide a signal of another potential when some of said output signals are in said first state,
   timing means responsive to a signal for providing a signal to said second input of a first level during an interval and a second level thereafter,
   said logic means being designed on receipt of said second level timing means signal to provide a first output signal if there is then provided said one potential to said first input and a second output signal when there is provided said an other potential to said first input.

2. Malfunction detection apparatus as claimed in claim 1 combined with circuit means for receiving at an input the output signals from said logic circuit, and to receive at at least one other input one or another potential signals, similar to said output signals, from a static condition sensing circuit, said last mentioned circuit means being designed to provide one signal if there is an another level signal at one of its inputs and another signal if there is not.

3. Malfunction detection apparatus comprising:
   a plurality of sensor responsive elements corresponding to operations to be performed, each of said sensor-responsive elements being designed, responsive to a reset signal to provide an output of a first potential and responsive to a signal indicative of the performance of an operation to provide an output of a second potential, AND function means connected to receive the outputs of said sensor-responsive elements designed to provide a first potential when all sensor-responsive element outputs are at said second potential and a second potential when a least one of said sensor-responsive element outputs are at said first potential, timer means designed to initiate the timing of an interval on receipt of such reset signal and to provide as output signal at the end of said interval, logic means designed to receive the output of said AND function means and of said timing means and designed to provide a signal if the output of said AND function means is at said second potential when said end of interval timer signal is received.

* * * * *